(12) United States Patent
Riihimaki et al.

(10) Patent No.: US 7,791,506 B2
(45) Date of Patent: Sep. 7, 2010

(54) CONFIGURABLE NETWORKED USER INTERFACE AND SWITCH PACK

(75) Inventors: Roy E. Riihimaki, Libertyville, IL (US); Michelle D. Keimig, Pleasant Prairie, WI (US); Richard L. Dale, Freeport, IL (US); Daniel Mattson, Pleasant Prairie, WI (US)

(73) Assignee: ZF Friedrichshafen AG, Friedrichshafen (DE)

( * ) Notice: Subject to any disclaimer, the term of this patent is extended or adjusted under 35 U.S.C. 154(b) by 830 days.

(21) Appl. No.: 11/693,940

(22) Filed: Mar. 30, 2007

(65) Prior Publication Data

US 2008/0238650 A1    Oct. 2, 2008

(51) Int. Cl.
*H03M 11/00* (2006.01)

(52) U.S. Cl. .................. 341/32; 341/20; 200/19.36; 200/404; 335/205

(58) Field of Classification Search ............ 341/20, 341/22, 32, 34; 361/679.4; 200/19.36, 404; 335/205–207
See application file for complete search history.

(56) References Cited

U.S. PATENT DOCUMENTS

| | | | |
|---|---|---|---|
| 3,573,369 A | 4/1971 | Konig et al. | |
| 3,588,875 A | 6/1971 | Gabor | |
| 3,623,080 A | 11/1971 | Scarbrough | |
| 3,623,081 A | 11/1971 | Scarbrough | |
| 3,641,531 A | 2/1972 | Heartz | |
| 4,117,438 A | 9/1978 | Kim et al. | |
| 4,298,861 A | 11/1981 | Tellerman | |
| 4,344,068 A | 8/1982 | Thompson et al. | |
| 4,366,463 A | 12/1982 | Barker | |
| 4,791,311 A | 12/1988 | Vig | |
| 4,831,218 A | 5/1989 | Wright | |
| 5,325,083 A | 6/1994 | Nassar et al. | |
| 5,364,272 A | 11/1994 | Herman et al. | |
| 5,579,002 A * | 11/1996 | Iggulden et al. ............... 341/23 |
| 5,729,222 A | 3/1998 | Iggulden et al. | |
| 5,811,891 A | 9/1998 | Yanase | |
| 5,861,796 A | 1/1999 | Benshoff | |
| 6,043,644 A | 3/2000 | de Coulon et al. | |
| 6,067,302 A | 5/2000 | Tozuka | |
| 6,140,593 A | 10/2000 | Bramesfeld et al. | |

(Continued)

FOREIGN PATENT DOCUMENTS

EP    1289339 A2    8/2002

(Continued)

*Primary Examiner*—Albert K Wong
(74) *Attorney, Agent, or Firm*—David W. Okey

(57) ABSTRACT

A printed circuit board (PCB) has a plurality of switch interfaces on its top surface. Each interface is an array of sensors, such as proximity sensors, hall-effect sensors, or a series of inductor coils. The sensors in each array are closely mounted and are all the same for a given PCB. Each array may or may not mount a non-contacting switch selected from a plurality of different types of switches, such as a single push button switch, dual push button switch, a toggle switch, a 3-position rocker switch, a rotary switch, or other type switch. Each switch mounted on the PCB includes one or more indicators for sensing by the sensors or coils, with feedback to determine what type of switch is mounted in each position. The same PCB, or other mount, may thus be used for a variety of unique applications, such as switch packs used in vehicles.

25 Claims, 11 Drawing Sheets

U.S. PATENT DOCUMENTS

| | | |
|---|---|---|
| 6,163,282 A | 12/2000 | Mitsuzuka |
| 6,265,788 B1 | 7/2001 | Davidson et al. |
| 6,426,572 B1 | 7/2002 | Terashita et al. |
| 6,587,056 B1 | 7/2003 | Fraser et al. |
| 6,635,972 B1 | 10/2003 | Barthel et al. |
| 6,650,254 B1 * | 11/2003 | Rix .............................. 341/22 |
| 6,724,102 B1 | 4/2004 | Kelwaski et al. |
| 6,788,285 B2 | 9/2004 | Paolucci et al. |
| 6,841,895 B1 | 1/2005 | Kelwaski |
| 6,852,937 B2 | 2/2005 | Zapf et al. |
| 6,903,662 B2 | 6/2005 | Rix et al. |
| 6,912,126 B2 * | 6/2005 | Rudd et al. ............... 361/679.4 |
| 6,919,817 B2 | 7/2005 | Choi et al. |
| 6,961,005 B2 | 11/2005 | Clement et al. |
| 7,152,651 B2 * | 12/2006 | Fujiwara ..................... 156/574 |
| 7,157,651 B2 | 1/2007 | Rix et al. |
| 7,161,348 B2 | 1/2007 | Luber et al. |
| 7,525,453 B2 * | 4/2009 | Henty ......................... 341/22 |
| 2005/0258687 A1 | 11/2005 | Zapf et al. |
| 2006/0132120 A1 | 6/2006 | Luber et al. |
| 2006/0266587 A1 | 11/2006 | Sorenson |
| 2006/0290346 A1 | 12/2006 | Habenschaden et al. |

FOREIGN PATENT DOCUMENTS

| | | |
|---|---|---|
| EP | 1672323 A2 | 5/2005 |
| WO | WO2005/027347 A1 | 10/2004 |

* cited by examiner

Z Travel for Vertical Switch Activation

Z Position for Activating Intelligence Coils

Constant Z Position for Horizontal Switch Activation (Rotary)

CONFIGURABLE NETWORKED USER INTERFACE AND SWITCH PACK

BACKGROUND

The field of the invention is electrical switches, or operator interface devices, and the use of electrical switches, or operator interface devices, in a variety of applications, especially in non-automotive vehicles.

Vehicles are used in many applications in today's world. The many different applications call for vehicles with a variety of capabilities. Non-automotive vehicles may include commercial trucks, tractors, farm equipment, utility vehicles, recreational vehicles, motor homes, buses, and so forth. Typically, every vehicle has a multitude of electrically controlled sub-systems. Examples of common sub-systems include exterior lighting, interior lighting, entertainment systems, heating and air conditioning. Additionally, the vehicle may have more specialized sub-systems such as lifts, pumps, mowers, harvesters, shovels, etc. Each of these sub-systems has some requirement for operator input.

The operator input may be as simple as on/off, or the operator may be required to adjust a value to a particular level. Traditionally, operator input devices for these functions have been rocker switches, toggle switches, push buttons, rotary knobs, and slide actuators. Each of these devices incorporates electrical switch contacts or resistance elements with wiping contacts. Further, each may be individually mounted and wired.

The number and arrangement of individual switches, knobs, and other user input or interface devices in a vehicle depends on many factors. For instance, standard sub-systems may be included on one model of a vehicle but not on other models from the same manufacturer. Further, some sub-systems may be included as optional equipment only, depending on customer requirements. Finally, a manufacturer may also offer optional equipment to be installed after the vehicle is shipped from the factory. All of this variety contributes to complexity in operator panel layout and wiring.

Each different type of input device may require a different type of mounting, termination, or wiring. In vehicles with many different options, there may be an extraordinary number of input devices and mounts. Each one requires connections to a certain number of wires or cables, and configuring the hardware and cables alone requires extensive customization of each vehicle and each option available for the vehicles. It is often impossible to incorporate all variations into the factory wiring harness. Therefore, the time and expense of engineering, mounting, and wiring operator interface panels is a significant part of the total vehicle cost.

Control networks have been proposed as a way to simplify vehicle wiring. A control network allows many input and output devices to share a small number of wires. With an appropriate communications protocol, devices may be added or removed without additional wiring. It is possible to add network communication capability to conventional operator input devices. However, there are drawbacks. A network interface is a microcontroller-based circuit. The microcontroller receives signals from operator input devices and communicates input status on the control network. The signals that are controlled by user input devices are low energy (i.e., very low current and low voltage). Switches that were designed for high current loads may be unreliable when applied in low energy circuits. Contaminants or moisture on the contacts present high impedance to current flow, resulting in poor switch performance. Switches with gold contacts and robust sealing are often employed to assure reliable operation.

The cost to add a network interface to each operator input device could easily exceed the cost of the device itself. Also, gold contacts and sealing add cost to each switch. Thus, adding a network interface to each device would simplify the vehicle wiring, but cost would increase dramatically. A less costly approach is to add a network interface for a complete operator interface panel. Using traditional operator input devices, this approach still is limited by the needs of particular wiring arrangements for each device.

Further, every electrical contact or connection is a potential point of failure. The more electrically active devices there are in the operator interface, the greater the potential for failure. What is needed is a way for many operator input devices to be arranged in a single panel with a greatly reduced number of electrical contacts, connections, and active devices. The solution should also allow the number, type, and arrangement of individual devices to be changed without significant costs for engineering or manufacturing. What is needed is a way to mount several types of switches in a common mount that could used for a great many applications.

SUMMARY

Our concept for networked user interfaces or switch packs provides a lower-cost, higher-reliability way to implement operator inputs without requiring power control. Power is controlled by other network systems, not by our operator interface and switch pack, which may be used in many different types of systems.

Embodiments of the present invention meet this need in a configurable network switch pack, or in other words, a configurable network user interface pack. The configurable pack can accommodate a variety of switch types, or user interfaces, and thus may be adapted to vehicles or applications requiring customized switches or user interfaces. The configurable pack may be wired into its application by a cable bundle or other hard wiring, but is also capable of multiplexing through a network connection with a control system operating the vehicle or application. This allows the configurable pack to easily interface with a user's network, while allowing a great degree of customization for the number and type of switches or user interfaces used.

One embodiment is a configurable network switch pack. The configurable network switch pack includes a plurality of arrays of inductive coils, each array configured for interfacing with a switch without contact with the switch, wherein the coils are arranged in a pattern and are mounted in a planar manner on a substrate; there is also a plurality of switches mounted above the arrays, each switch further comprising at least one object for identification and at least one object for actuation, wherein each array is configured for sensing the objects for identification and operation. The switch pack also includes a microcontroller mounted on the substrate and in communication with the arrays, wherein each array is configurable for interfacing with a plurality of switches, one at a time, by programming the microcontroller, and wherein the microcontroller is configured for determining an identification of each switch by sensing the object for identification and for determining a position of each switch by sensing the object for actuation.

Another embodiment is a configurable network switch pack. The configurable switch pack includes a switch housing, a plurality of arrays of inductive coils, each array configured for interfacing without contact with at least two switches, wherein the arrays are arranged in a pattern and are mounted in a planar manner on a substrate within the housing, a plurality of switches mounted above the printed circuit board, each switch mounted above a particular array and each switch further comprising at least two objects for being sensed by at least two different coils in the particular array above which it is mounted, and a microcontroller connected to the plurality of arrays. There is also a multiplexing circuit connecting each of the arrays with the microcontroller, wherein the multiplexing circuit is configured for sequentially interfacing each array with the microcontroller to determine an identification and a position of each switch using the objects, and wherein the microcontroller is programmed for the identification of each switch by a pattern of the coils that are activated by at least one of the at least two objects and wherein the position of each switch is determined by a pattern of the coils that are activated by at least the other of the at least two objects.

Another embodiment is a configurable network switch pack. The configurable network switch pack includes a switch housing, a plurality of arrays of proximity sensors, each array configured for interfacing without contact with at least two different switches, wherein the arrays are arranged in a pattern and are mounted in a planar manner on a printed circuit board within the housing, and a plurality of switches mounted to the housing above the printed circuit board, each switch mounted above a particular array and each switch further comprising at least one indicator for identification and at least one indicator for actuation for interfacing with the proximity sensors of the particular array above which it is mounted. There is also a microcontroller connected to the plurality of arrays, an oscillator connected to the coils and configured for activation of the coils, and a multiplexing circuit connecting each of the arrays with the microcontroller, wherein the microcontroller is configured to determine and identification and a position of each of the plurality of switches.

Another embodiment is a configurable network switch pack. The configurable network switch pack includes a switch housing and a printed circuit board comprising a plurality of arrays of proximity sensors mounted in a planar manner on the board, the board further comprising a microcontroller, an oscillator, and a circuit for sequentially connecting the microcontroller with the arrays of sensors. There is also a plurality of switches configured for interfacing with the plurality of arrays, each switch mounted above one of the plurality of arrays, and a first device for identification and a second device for actuation mounted on each of the plurality of switches, the devices configured for detection by the sensors without contacting the sensors, and each switch configured so that a change of position of the switch alters a position of at least the device for actuation.

Another embodiment is a method of using a switch pack. The method includes configuring a switch pack having at least two switches, each switch mounted above an array of proximity sensors and configured for contactless operation, the switch pack further comprising a substrate on which each array of proximity sensors is mounted in a planar manner, and exciting at least one proximity sensor from the array of proximity sensors. The method also includes determining an identification of each switch by detecting a presence of at least one identification indicator from each switch, determining a position of at least one switch by detecting a sensing at least one actuation indicator from the at least one switch, and operating a device selected from the group consisting of a vehicle, a piece of equipment, or machinery by using an output from the switch pack for the at least one switch.

Additional features and advantages are described herein, and will be apparent from, the following Detailed Description and the figures.

DETAILED DESCRIPTION

Embodiments of the present invention provide a novel and economical way to accommodate the need for a plurality of switches in a variety of vehicles and applications using electric power. Embodiments may advantageously used in machinery, tractors, trucks, farm implements, industrial equipment, mobile homes, and the like. The advantage lies in the principle that a single printed circuit board and a plurality of arrays of proximity sensors may be adapted to a variety of situations, each situation unique and using different switches to perform different functions. For example, some applications may have one or more of the following functions, and a switch pack as described herein may be configured for controlling the switch functions: a power on/off switch, a pump switch, a speed control switch, a temperature adjust switch, a level control switch, one or more sets of lights, a valve open/close switch, and so forth. The proximity sensors may be inductive sensors such as inductive coils, hall-effect sensors, capacitive sensors, magnetic proximity sensors, and so on. The sensor may be activated by an appropriate part on the switch that is sensed, such as a small piece of preferably magnetic-conducting metal, or a small magnet.

Figure 1:
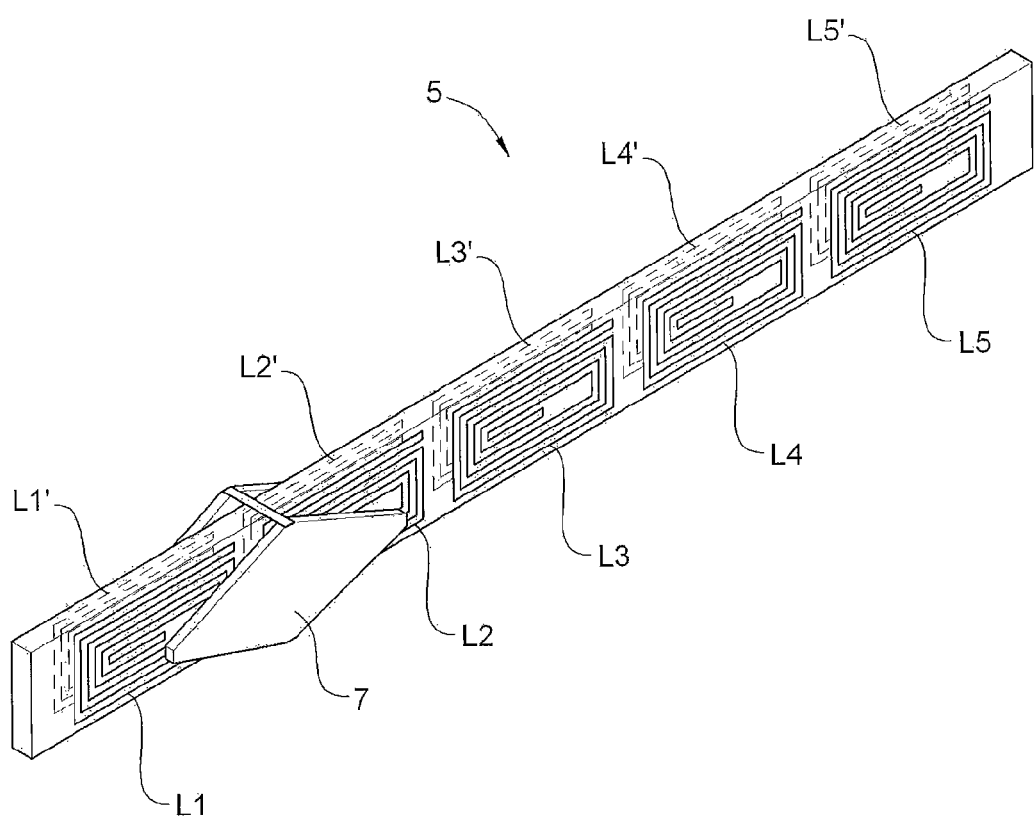
FIG. 1 depicts prior art in the field.

The position of the switch is determined by the effect of the sensed portion on one or more of the proximity sensors, preferably an array of inductive coils. That is, maneuvering or operating the switch also maneuvers a magnet or a magnetically-conductive piece of metal near one or more induction coils. When the magnet or metal nears the coil, the sensor detects its presence, and in the case of inductive coils, an inductance is induced in the coil. This inductance is read by an electric circuit connected to the coils and is interpreted as a position or a movement of the switch. A prior art inductive sensor unit is depicted in U.S. Pat. No. 7,161,348, which is owned by the assignee of the present patent, and is incorporated herein by reference. This patent teaches several coils in a linear array. An actuator for the switch also moves a metal plate in a linear manner over the coils. The position of the metal plate, and thus the actuator, is determined by the inductance that results in the coils. See FIG. 1, which depicts a printed circuit board 5 with a plurality of coils L1, L1', ... L5, and L5'. As the metal plate 7 is advanced over the coils, each coil in turn has an increased inductance from the presence of the metal plate. A circuit connected to a controller reads the inductance and infers the position of the metal plate and thus a position of an object attached to the metal plate. The prior art demonstrates that the inductive effect of a metal near a coil can be used to determine the position of the metal and a related object.

Figure 2:
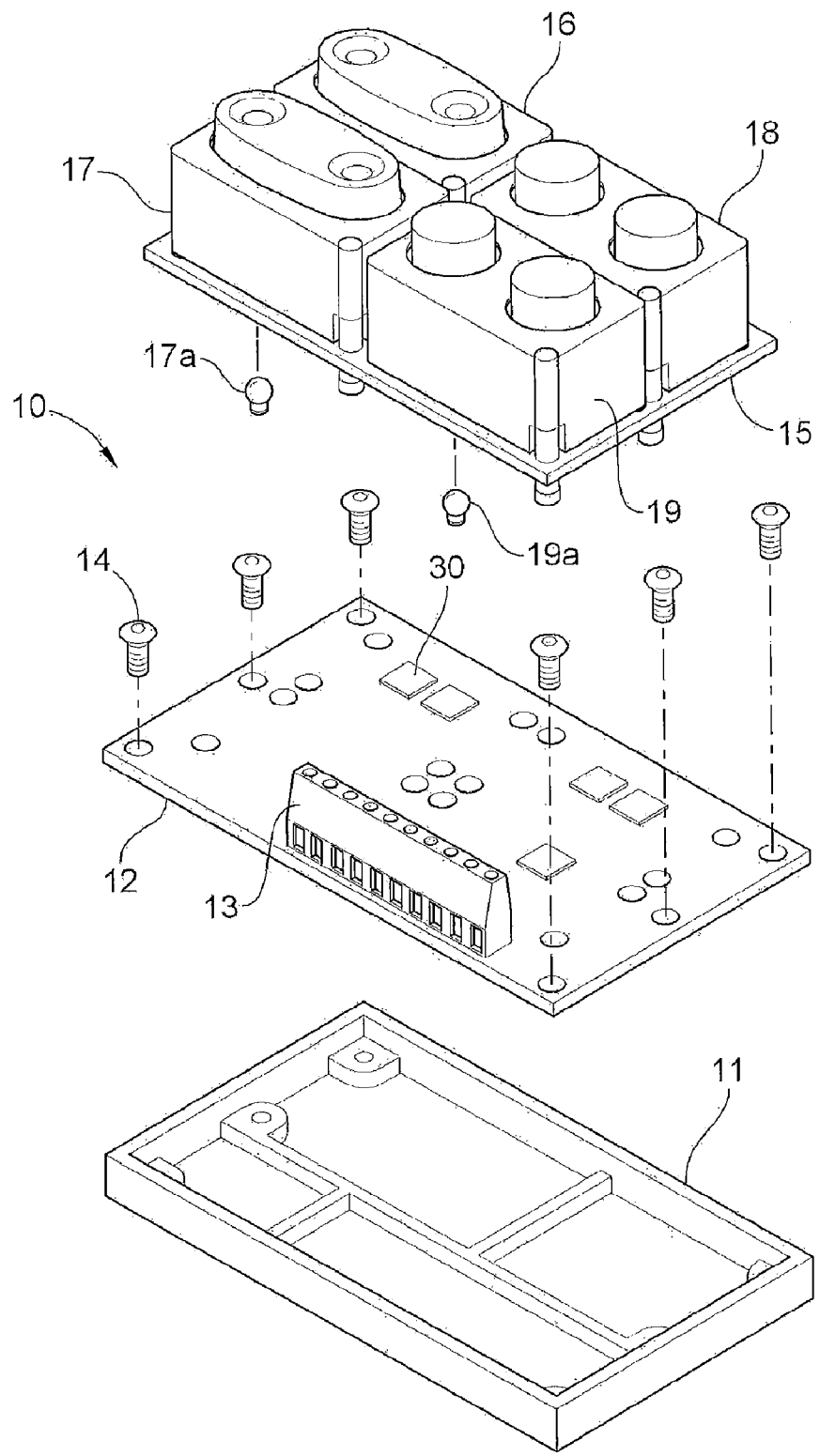
FIG. 2 depicts a first embodiment of contactless switches.
Figure 3:
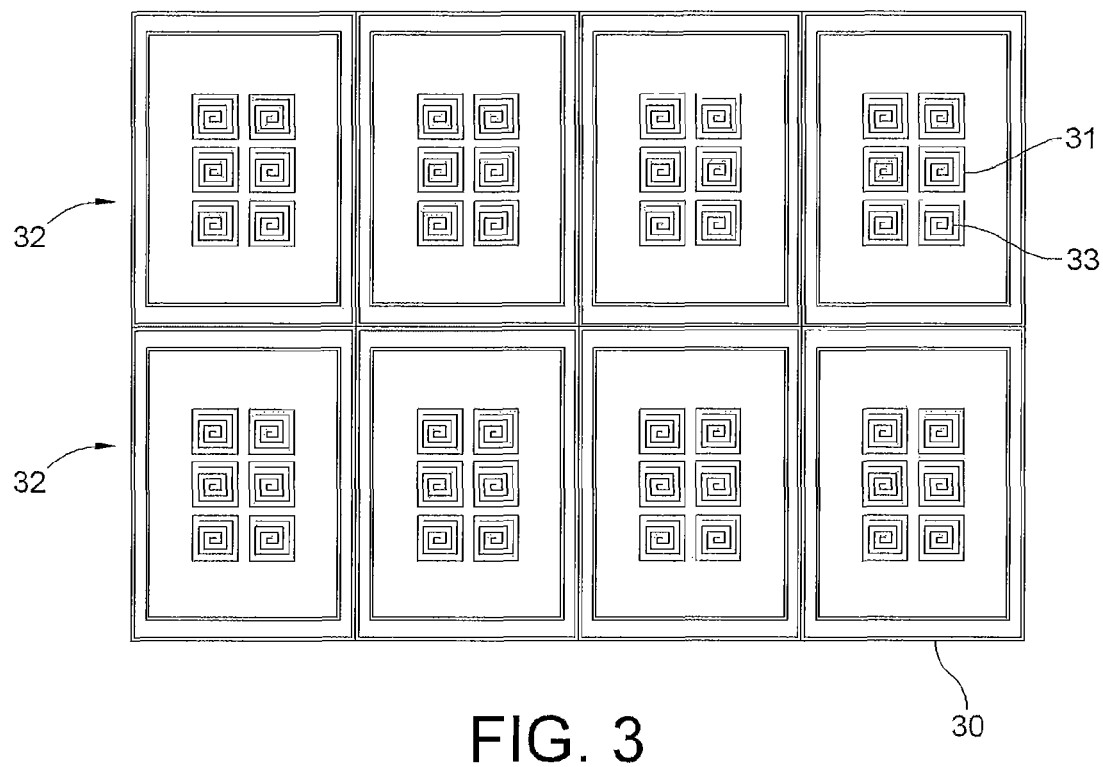
FIGS. 3-4 depict arrays of conductive coils.

A first embodiment of a configurable pack is depicted in FIGS. 2-3. The configurable pack 10 includes a housing bottom 11 and a printed circuit board or circuit card 12 with a plurality of arrays 30 of inductive coils on a top surface of the circuit. The circuit board or card 12 has a connector 13 for connecting to a variety of outside circuits. The pack also includes a top housing 15 and a plurality switches 16, 17, 18, 19, which may the same switches or may be different switches. The switch pack may includes incandescent or LED lamps, such as LEDs 17a, 19a, for use with switches 17 and 19, respectively. There may also be fasteners 14 for securing or mounting the housing top and the circuit board. The arrays of coils 30 are more easily seen in FIG. 3.

Each configurable network pack uses a plurality of "switches." The term switch usually means an electrical device with contacts, so that altering the position of the switch alters the state of the contacts, and turns a device on or off. In the present patent, the term "switch" is used to include electrical devices with at least two states, such as on or off, so that altering the position of the switch alters the state of the switch, but in a contactless manner, as well as traditional switches with contacts. Contactless "switches" might be termed more properly "user interface devices," since users will push on a rocker or toggle, just as they would a switch with contacts, to actuate or de-actuate a downstream device. However, embodiments of the present invention already have a name that is fairly cumbersome, and the term "configurable network user interface pack" seems less descriptive than "configurable network switch pack." Accordingly, the term "switch" as claimed herein will include electrical devices that have contacts, as well as contactless devices, and the term configurable network switch pack will refer to an array including at least two contactless switches.

Figure 4:
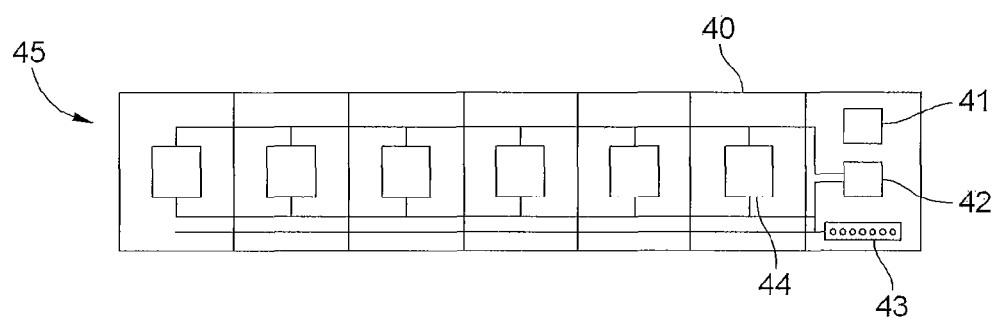

FIGS. 3-4 depict two possible configurations of proximity sensors. Printed circuit board (PCB) 30 includes a plurality of sensors 31 in two rows 32, each row having four sensors 31. Each sensor 31 is an array of inductive coils 33, the array including 6 coils in a 2×3 array. PCB 30 would thus be able to accommodate eight switches, as shown in FIG. 2. Of course, other configurations and other sensors are also possible, such as the single row, 6-switch PCB 40 depicted in FIG. 4. PCB 40 includes a microcontroller 41, memory 42, an I/O connector 43, and six sensors 44 in a single row 45. Each sensor 44 is a hall effect sensor, which works best when the switch with which it is used includes a small magnet to be detected by the hall effect sensor. Hall effect sensors are made by many manufacturers, such as Allegro MicroSystems, Inc., Worcester, Mass. and Analog Devices, Norwood, Mass., both in the USA.

It is understood that embodiments may use virtually any proximity sensor that is suitable for the application. Other suitable proximity sensors may include inductive, capacitive, magnetic detection, and infrared sensors with suitable sensitivity. Under the proper conditions, optical sensors could be used, but would be more expensive than necessary or desirable for automotive applications. For example, if "pitch and catch" optical sensors are mounted in an array on a printed circuit board, any piece of metal, as described, or plastic, that interrupts the light could be used as objects in the circuit for identification and actuation. Ultrasonic sensors could be mounted in an array on a printed circuit board, and objects such as pieces of metal, plastic, or other material could be used in the switches or user interface devices as objects for identification and actuation.

Figure 5:
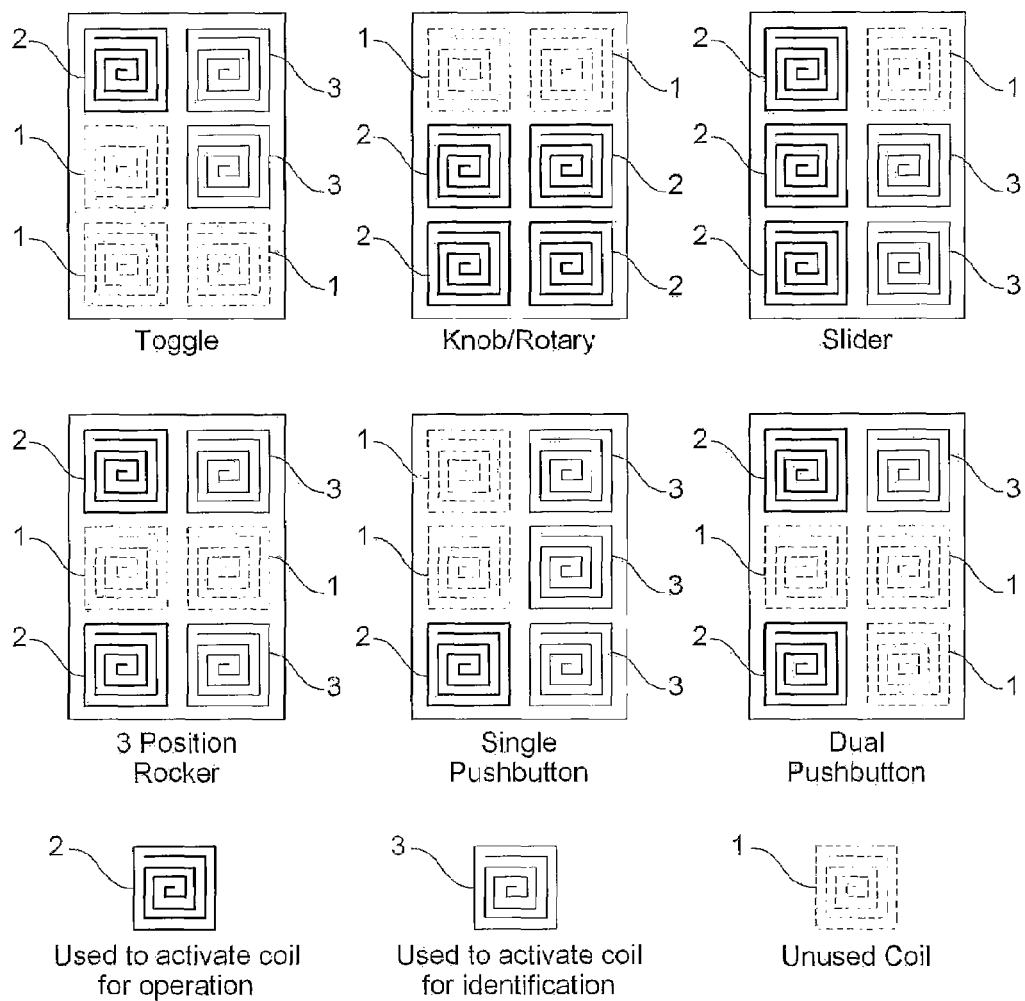
FIG. 5 depicts functions of conductive coils in an array of coils.

One embodiment of an array of sensors that has been found to work well is depicted in FIG. 5. Each of the several switches depicted in FIG. 5 may be used with the array depicted. The array of 6 sensors, in 3 rows of 2 sensors each, includes sensors, such as coils 1, that are not used, coils 2 that are used to activate a device, and coils 3 that are used to identify the switch that is installed over the array. For a toggle switch, the bottom row, two sensors or coils 1 are unused, as is the left coil 1 in the middle row. The left coil 2 in the top row senses inductance, or otherwise changes its state, when the toggle switch is toggled, and a device downstream is activated. The right coils 3 in the top two rows are used to identify the particular switch involved. That is, the controller in communication with this toggle switch has been programmed to recognize that the switch is a toggle switch when these two coils or sensors are activated upon installation. As noted above, this may be accomplished by two short lengths of metal, or a single longer length of metal or magnet that near sensors or coils 3 when the switch is installed above the array.

A rotary switch or knob may include a top row with two unused coils 1 and the remaining coils 2 used only for activation or operation of a downstream device. In this case, as the switch is rotated, a magnet or length of metal attached to an underneath stem of the knob may approach first one and then another of the coils 2, with each successive coil resulting in another output for the downstream device, such as increased auger rotation, light intensity, and so forth. The slider switch, also known as a linear switch, has a single unused sensor 1, two sensors 3 for identification, and three sensors 2 in a single line. A slider switch may have one position for OFF, a second position for high power, and an intermediate position for moderate power.

A 3-position rocker switch may leave the middle row of sensors 1 unused, with the upper and lower right sensors 3 used for identification. The upper and lower left sensors 2 are used for activation. In one example, the rocker may use a middle position for OFF, a rocking motion on one side for "open" and a rock on the other side for "close." Similar uses are envisioned for a single pushbutton switch, with only coil 2 used for activation, and the three right side coils used for identification of the switch as a single pushbutton switch. A dual pushbutton switch may use upper and lower sensors 2 for activation of the downstream device, as in the upper pushbutton for OFF and the lower pushbutton for ON. The microcontroller on the PCB is programmed to recognize the unused sensors, the identification sensors, and the sensors used for activation of downstream devices. In other embodiments, a single coil or sensor may be used for both identification and for actuation, but it is preferable to separate these important functions.

Figure 6:
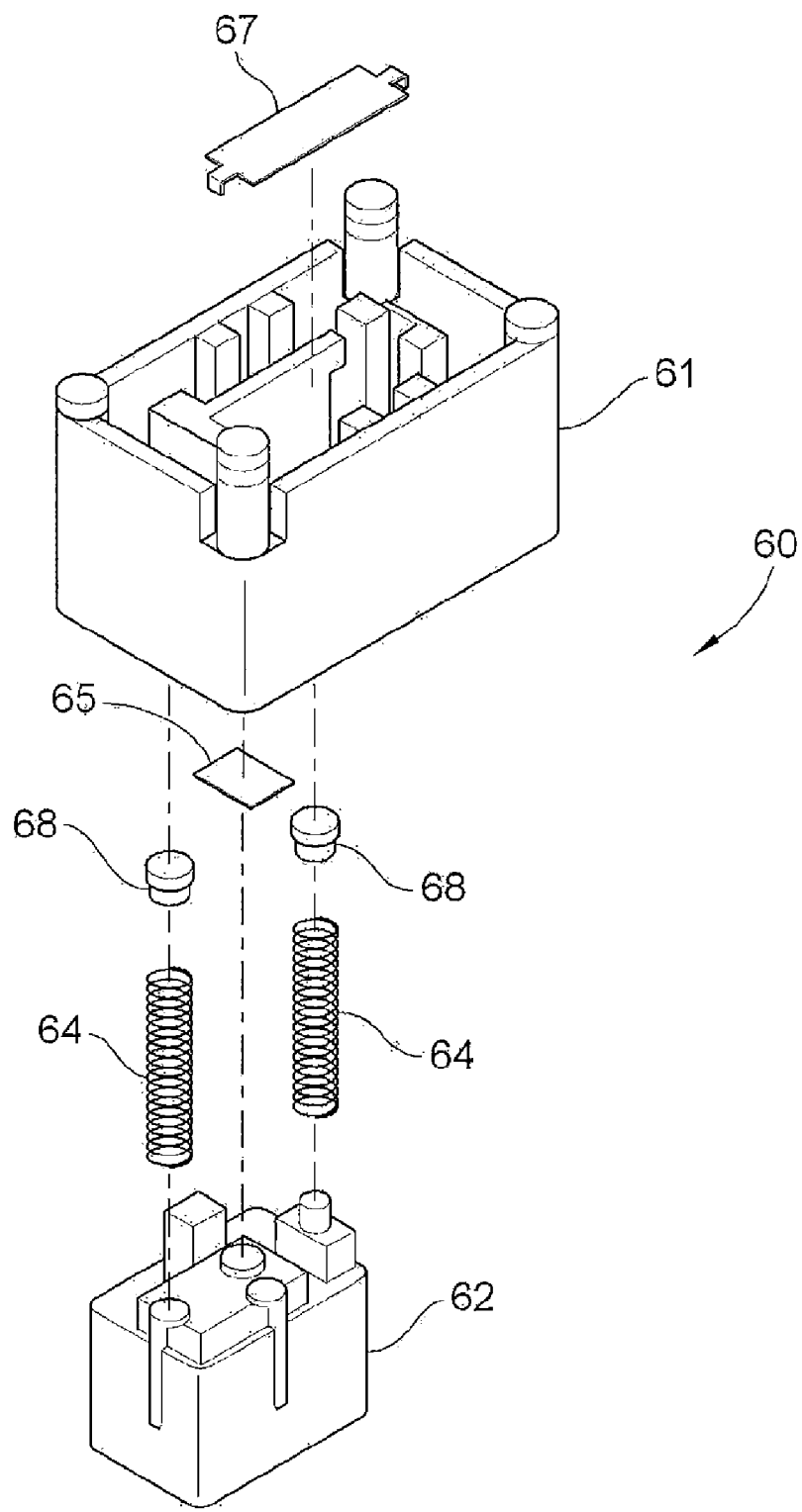
FIG. 6 is an exploded view of a single pushbutton switch useful in embodiments of contactless switches.
Figure 7:
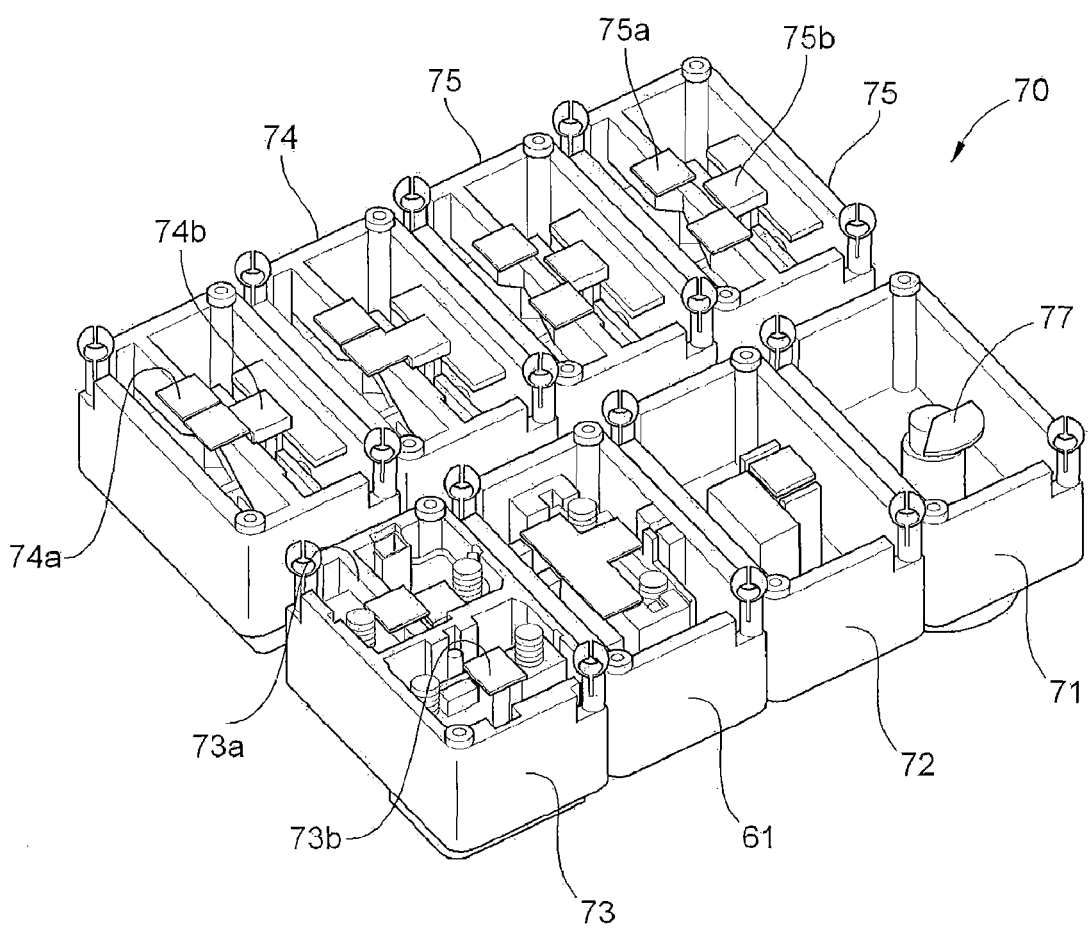
FIG. 7 is a bottom view of a switch pack with a plurality of switches depicting positions of magnetically conductive materials functioning as sensors.

Each type of switch will be different, as recognized by those skilled in the art. The example shown in FIG. 6 for a single pushbutton 60 switch is exemplary and is not meant to limit the possible embodiments. Single pushbutton switch 60, shown upside-down in this figure) includes switch housing 61 and single pushbutton actuator 62. Two compression springs 64 mount with feet 68 to a position within housing 61. Indicator 65 may be a short length of metal mounted to the underside of actuator 62. As seen in FIG. 5, a push-button switch should have an actuation indicator near the lower left of the sensor array. In FIG. 6, indicator 65 for actuation of the switch will be positioned near the lower right of upside-down switch 60 for interaction with the lower left coil in the array of FIG. 5. In FIG. 6, indicator 67 is mounted permanently to the bottom of housing 61 on the left side of the housing for identification of the switch as a single pushbutton switch.

Note that three of the coils in FIG. 5 for a push button switch are used for identification (three coils on the right side), thus requiring a longer indicator 67 for identification than the indicator 65 for actuation. When single push-button switch 60 is installed near the appropriate sensor array as depicted in FIG. 5, the indicator 67 will identify the switch as a single pushbutton switch because the three coils on the right side will sense the presence of indicator 67. When a user desires to actuate the switch and presses the actuator or pushbutton 62, indicator 65 will near the lower-left coil. The lower left coil will sense the presence of the indicator and will send a signal to the microcontroller to energize a motor, lights, or other downstream device.

Figure 8:
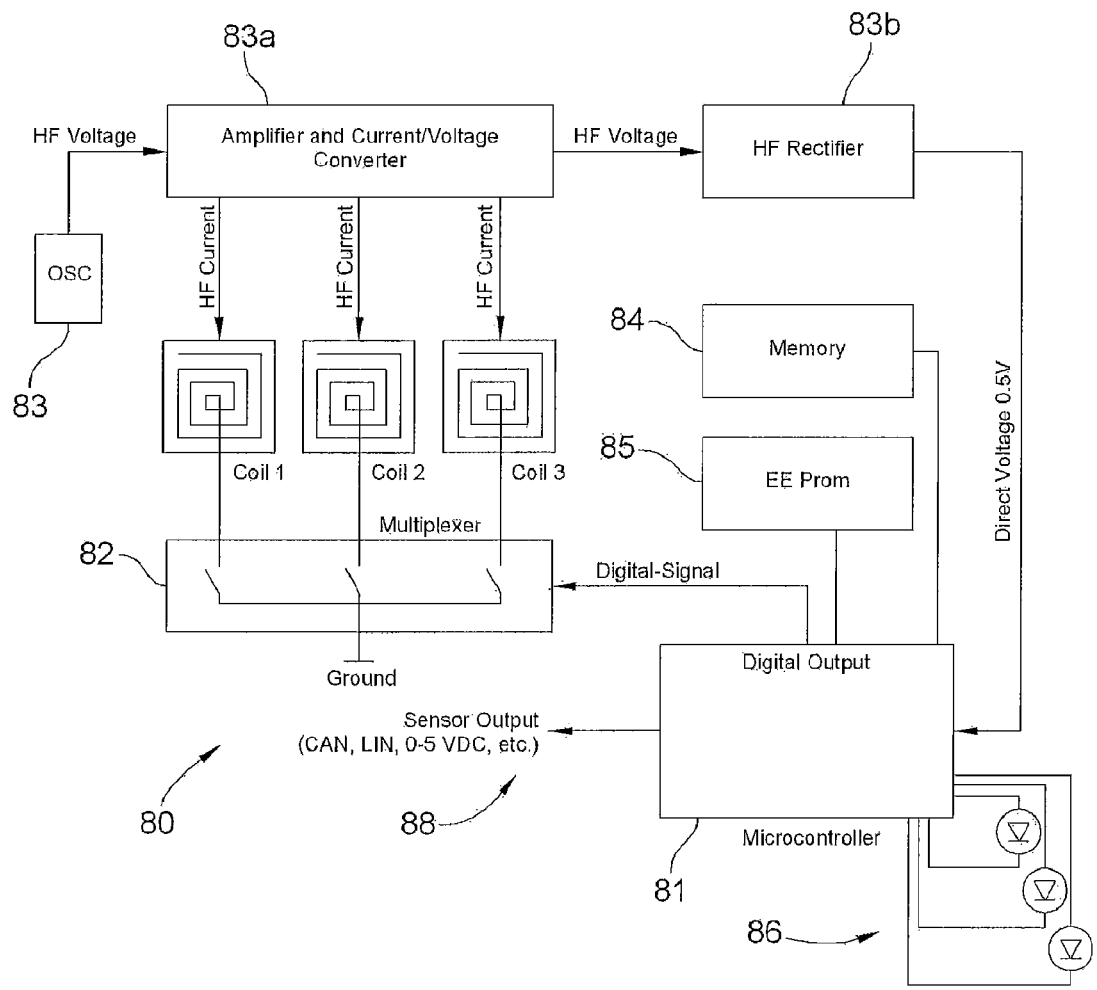
FIG. 8 is a schematic view of a control system for a switch pack.

Similar logic will apply to the placement of indicators for each of the other switch types envisioned. FIG. 8 depicts a bottom view of one embodiment of a switch pack 70 with eight switches. Lower right hand switch 71 is a rotary switch, as can be seen by the central stem and indicator 77. Switch 72 is a linear slider switch, with a shorter single indicator on its right for actuation (over three coils) and a longer indicator on its left for identification. Switch 61 is a single pushbutton switch, as discussed. Switch 73 is a dual pushbutton switch, with a single indicator 73 for identification and two indicators 73b for actuation. Switches 74 are toggle switches, with two short indicators 74a for identification and a single indicator 74b for actuation. Switches 75 are 2-position rocker switches, with two short indicators 75b for identification and a single short indicator 75b for actuation.

Figure 9:
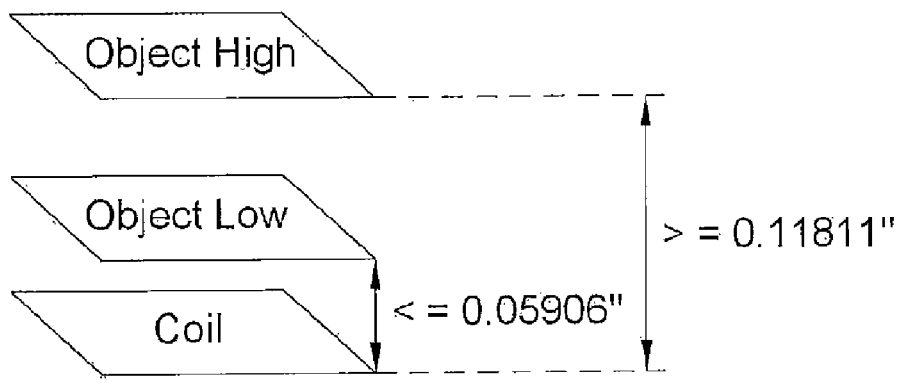
FIG. 9 is an illustration of distances used in embodiments.
Figure 9:
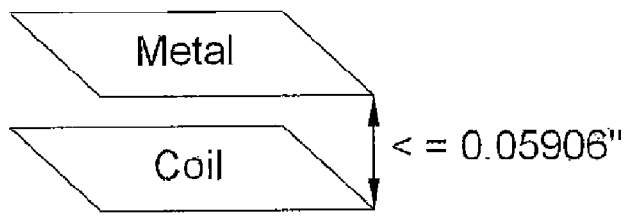
Figure 9:
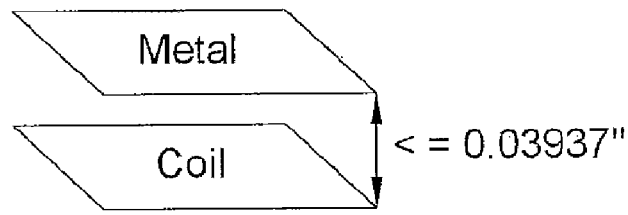

FIGS. 8-9 help to illustrate the workings of embodiments of the invention. A control schematic 80 includes a microcontroller 81, preferably with memory 84 and a programmable permanent memory 85. The microcontroller is in contact with each array of coils or sensor through a multiplexing circuit 82. This circuit allows the controller to read the state of each switch by reading each array sequentially, such as at a rate of 1-10 kHz. Each sensor receives signals, such as 12 MHz signals, from an oscillator 83, the oscillator also mounted on the same circuit board, flex print, or other mount with the microcontroller, the arrays of sensors, etc. The oscillator circuit also includes an amplifier/voltage converter 83a and a rectifier 83b. The oscillator may also send a signal to the microcontroller so the microcontroller is aware that the circuit is functioning properly.

When the circuit board is assembled, the microcontroller is programmed for the type and of sensors and types and numbers of switches used for the particular switch pack. The microcontroller may also be programmed to allow for illumination, such as for one or more LEDs 86 or other lamps to be used in particular switches of the switch pack. When a switch is installed, the identification indicators will signal the microcontroller the presence of the switches, and an initial check may be completed that the correct switches are present and installed correctly. The switches may then be checked for function, i.e., actuated, to see if the sensors correctly sense the presence of the actuation indicators. A great many microcontrollers, and microprocessor controllers, are suitable for this application. Indeed, even application specific integrated controllers (ASICs) may be used. We have found that microcontrollers from STMicroelectronics, Austin, Tex., work well, especially the ST-5 and ST-7 series, including model ST72561. Other microcontrollers that will be satisfactory include those from Freescale Corp., Austin, Tex., or Atmel Corp., San Jose, Calif., including models such as the Atmel ATMEGA 16 or ATMEGA 128. Other models from Intel, such as Intel 8051 and 80251 should perform satisfactorily.

The switch pack control board will have a plurality of I/O lines 88 for power in and for control of the downstream devices controlled by the switches of the switch pack. As noted above, the switch pack may conform to a network output, and use its multiplexing capability to minimize the wires bundles and harnesses. For example, if the circuit conforms to CAN network standard, there may be only a 5 VDC and ground line in, and two control wires, for a four-wire cable. If the circuit conforms to LIN, there may be only a single control wire out, enabling use of a three-wire cable. Other network standards may apply, such as RS232, and so forth. This capability allows the switch pack to interface with another controller, such as a vehicle or other system controller. The position and output of the switches may thus be sent to another system controller and to the actual devices which the switches are controlling. The switch pack may thus be standardized in the sense that a single switch pack may be used in many applications, i.e., in many trucks, tractors, cars, or other movable or stationary systems. At the same time, the switch pack may be individually customized for each application, i.e., the desired mix of a certain number and types of switches, up to the maximum number of positions on the mount.

As noted above, the switches work by bringing an indicator into the presence of a sensor, and then noting the change in state of the sensor. The actuation may be "head-on" as when pushing a push-button or toggle switch, or may be linear, as when sliding a slider. Examples of hardware that has been tested are depicted in FIG. 9. The indicators used were 24-26 ga aluminum, about 0.018 to about 0.025 inches thick. Other thicknesses may be used, and other materials may also be used. Included are at least steel, copper, and tin-plated copper, along with any conductive metal.

For head-on or vertical actuation 91, a distance of about 0.060 inches was sufficient for actuation, and 0.118 inches for deactivation, that is, about 1/16 of an inch was enough to turn the switch on, and changing to about 1/8 of an inch was sufficient to turn the switch off. The same vertical distance, about 0.060 inches, or about 1/16 of an inch, was sufficient for noting the presence or absence of the identification indicators 92. For sliding actuation, as in rotary or linear actuators 93, performance was better when the indicator was closer to the sensor, about 0.040 inches (about 1 mm). These tests were conducted using coils made of copper with 11 turns and about 0.25 inches wide and 0.25 inches long.

As noted, coils that are embedded in the surface of a PCB are sensitive, small, may be placed very precisely, and are very economical. Thus, arrays of coils are a preferred embodiment. However, many other proximity sensors may also be used, including capacitive sensors, inductive sensors (other than the coils described herein), and so forth. It will be recognized that the object sensed, the indicators of the switch as described above, may be different for different sensors. Thus, short lengths or squares of ordinary steel may be used for inductive coil sensors. A magnet or other magnetically-conductive material may also be used. For hall-effect sensors, a tiny magnet will be preferred. For capacitive sensors, almost any electrically-conductive material may be used for the indicator.

Figure 10:
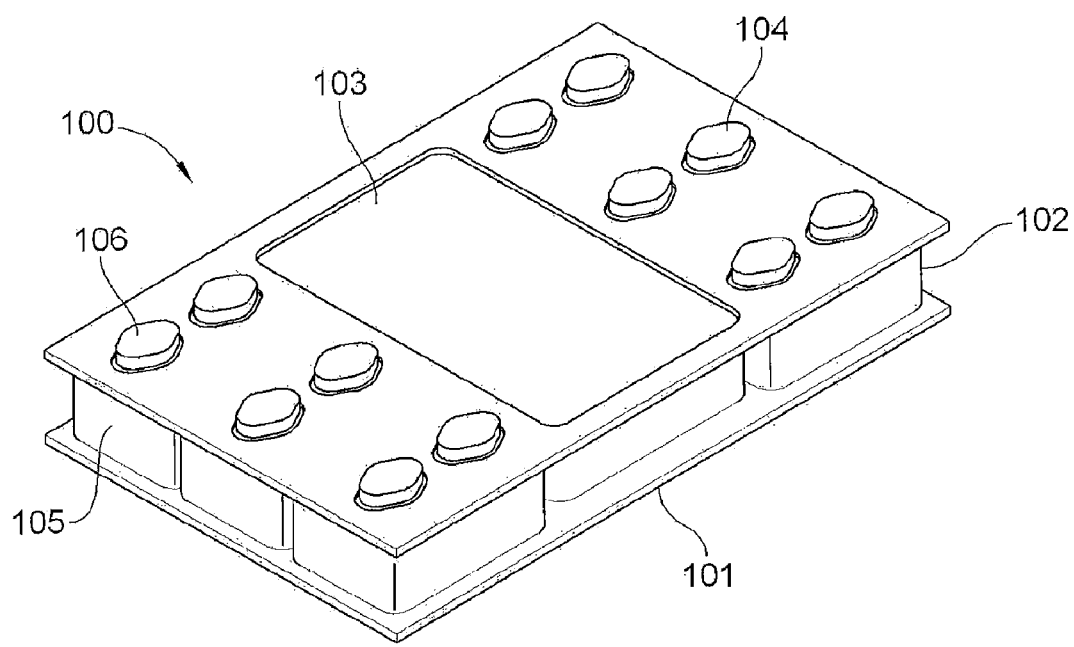
FIG. 10 depicts an embodiment with a display and two switch packs.

There are many embodiments of switch packs. One additional embodiment with a display is depicted in FIG. 10. Switch assembly 100 includes a mount 101, such as a PCB made from FR4, a housing 102, and a display, or graphical user interface 103. The display or interface is connected to the microcontroller and is configured to display information about the switch assembly, the switch packs 104, 105, and the status of individual switches 106 in the switch packs. The display is also optionally connected to sensors or equipment on board a machine or a vehicle, for displaying indications from the sensors, such as a travel length, a temperature, an oil pressure, or a current or voltage. The display may also be connected and configured to display status, such as interlocks closed or open, and so forth. In one embodiment, the display may be used to display a camera on the truck or vehicle for assisting the operator to monitor or operate the vehicle or auxiliary equipment of the vehicle.

Figure 11:
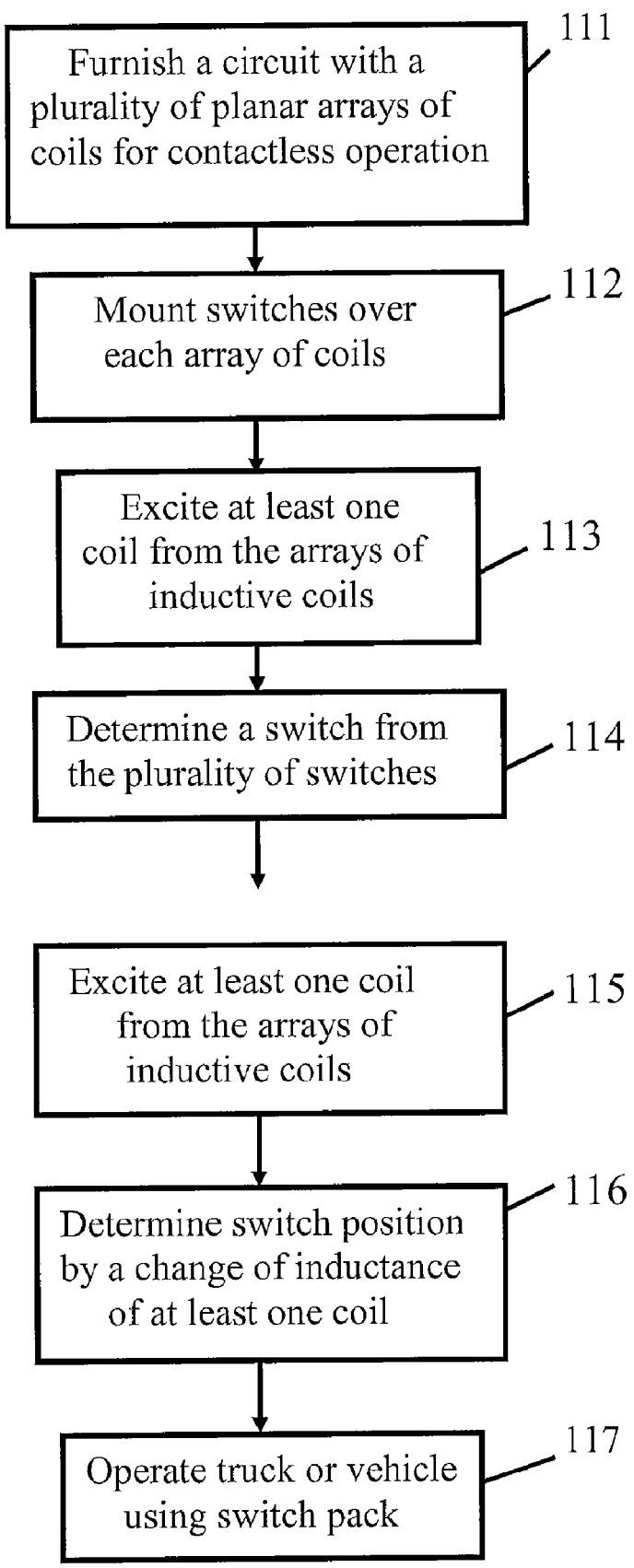
FIGS. 11-12 are flowcharts for methods of using a contactless switch pack.

A method of using a switch pack embodiment is presented in flowchart form in FIG. 11. The method includes furnishing or assembling 111 a circuit with a plurality of planar arrays of coils for contactless operation with a plurality of switches. The switches are then mounted 112 over the arrays of coils. To operate the switches, at least one coil from the arrays of inductive coils is excited 113. This causes a change in the inductance seen by the coil. The software programmed into the microcontroller than determines 114 which switch of the plurality of switches was excited. A second coil from the arrays of coils is then excited 115 when the switch is pressed or otherwise actuated. The microcontroller then determines 116 a position of the switch by noting the change of inductance in the coil. An operator can then operate 117 a vehicle a truck, or other object in which the switch pack is mounted.

Figure 12:
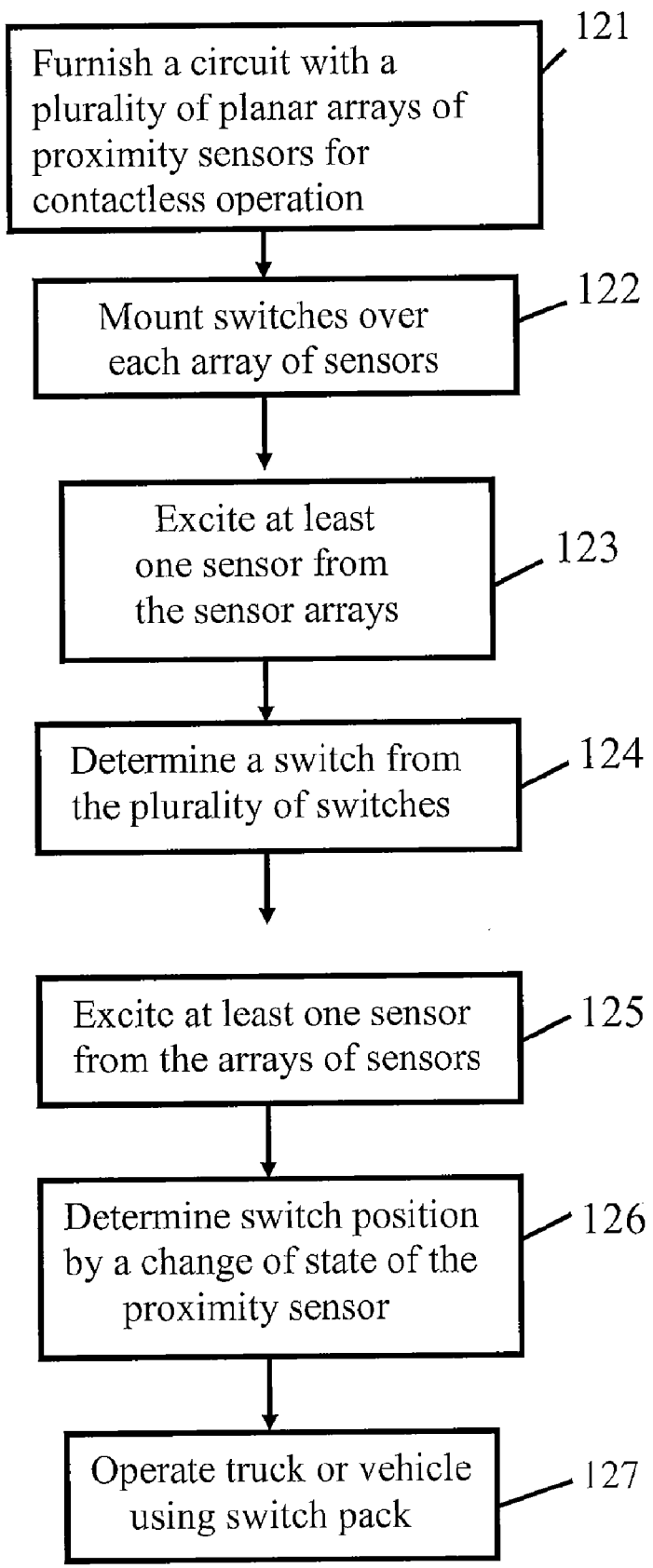

A more general method of using embodiments is depicted in the flowchart of FIG. 12. A circuit is furnished 121 with a plurality of planar arrays of proximity sensors for contactless operation. A plurality of switches is then mounted 122 over the arrays of sensors. At least one sensor from the sensor arrays is excited 123 for identification of the switch. The excitation is accomplished by bringing an object, such as a small length of metal or other object into a sensing range of the proximity sensor. The switch is then identified 124 from among the plurality of switches. At least one different sensor from among the array of sensors is then excited 125 in the same manner. The position of the switch is then determined 126 by the change in state of the proximity sensor. The operator can then operate 127 a vehicle, a truck, or other equipment in or on which the switch pack is mounted.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

What is claimed is:

1. A configurable network switch pack, comprising:
a plurality of arrays of inductive coils, wherein each array comprises at least a first coil for detecting an object for identification and at least a second coil for detecting an object for actuation, each array configured for interfacing with a switch without contact with the switch, wherein the coils are arranged in a pattern in a planar manner on a substrate;
a plurality of switches wherein each switch of the plurality of switches is located above a corresponding array, each switch comprising at least one object for identification and at least one object for actuation, wherein each array is configured for sensing the objects for identification and actuation; and
a microcontroller located on the substrate and in communication with the arrays, wherein each array is associated with one of the plurality of switches, one at a time, by programming the microcontroller, and wherein the microcontroller is configured for determining the identification of each switch by sensing the object for identification and for determining a position of each switch by sensing the object for actuation.

2. The switch pack of claim 1, wherein the objects are pieces of metal or magnets.

3. The switch pack of claim 1, further comprising a multiplexing circuit connected to the arrays for communication with the microcontroller.

4. The switch pack of claim 1, further comprising a cover for the printed circuit board, the cover configured for mounting the plurality of switches or plates.

5. The switch pack of claim 1, wherein the switch pack is configured for connection to a network using a network protocol selected from the group consisting of RS232, Linear Area Network and a Controller Area Network.

6. A configurable network switch pack, comprising:
a switch housing;
a plurality of arrays of inductive coils, wherein each array comprises at least a first coil for detecting an object for identification and at least a second coil for detecting an object for actuation, each array configured for interfacing without contact with at least two switches, wherein the arrays are arranged in a pattern in a planar manner on a substrate within the housing;
a plurality of switches located above the printed circuit board, each switch located above a particular array and each switch comprising at least one object for identification and at least one object for actuation for being sensed by at least two different coils in the particular array above which it is located;
a microcontroller connected to the plurality of arrays; and
a multiplexing circuit connecting each of the arrays with the microcontroller, wherein the multiplexing circuit is configured for sequentially interfacing each array with the microcontroller to determine an identification and a position of each switch using the at least two objects, and wherein the microcontroller is programmed for the identification of each switch by a pattern of the coils that are activated by at least one of the at least two objects and wherein the position of each switch is determined by a pattern of the coils that are activated by at least the other of the at least two objects.

7. The switch pack of claim 6, wherein the microcontroller is configured for a one wire or two wire output to a network connecting the switches to portions of a vehicle.

8. The switch pack of claim 6, further comprising an oscillator connected to the coils for sensing the objects.

9. The switch pack of claim 6, wherein the objects are selected from the group consisting of a metal, a magnet, and a magnetically-conductive material.

10. The switch pack of claim 6, further comprising a display for the switch pack, the display connected to at least the microcontroller and configured for displaying the identification and the position of the switches.

11. The switch pack of claim 6, wherein at least one switch further comprises a lamp.

12. A configurable network switch pack, comprising:
a switch housing;
a plurality of arrays of proximity sensors, wherein each array comprises at least a first proximity sensor for detecting an object for identification and at least a second proximity sensor for detecting an object for actuation, each array configured for interfacing without contact with at least two different switches, wherein the arrays are arranged in a pattern in a planar manner on a printed circuit board within the housing;

a plurality of switches located within the housing above the printed circuit board, each switch above a particular array and each switch further comprising at least one means for identification and at least one means for actuation for interfacing with the proximity sensors of the particular array above which it is located;

a microcontroller connected to the plurality of arrays;

an oscillator connected to the proximity sensors and configured for activation of the proximity sensors; and a multiplexing circuit connecting each of the arrays with the microcontroller, wherein the microcontroller is configured to determine an identification and a position of each of the plurality of switches.

13. The switch pack of claim 12, wherein the proximity sensors are capacitance sensors, hall effect sensors, magnet-detecting sensors, or inductance sensors.

14. The switch pack of claim 12, wherein the arrays and the switches are arranged in a single line or in two lines.

15. The switch pack of claim 12, wherein the switches are selected from the group consisting of a toggle switch, a rotary switch, a push button switch, a rocker switch, a linear slider switch, and a thumb wheel switch.

16. A configurable network switch pack, comprising:

a switch housing;

a printed circuit board comprising a plurality of arrays of proximity sensors located in a planar manner on the board, wherein each array comprises at least a first proximity sensor for detecting an object for identification and at least a second proximity sensor for detecting an object for actuation, the board further comprising a microcontroller, an oscillator, and a circuit for sequentially connecting the microcontroller with the arrays of sensors;

a plurality of switches configured for interfacing with the plurality of arrays, each switch located above one of the plurality of arrays; and a first device for identification and a second device for actuation located on each of the plurality of switches, the devices configured for detection by the sensors without contacting the sensors, and each switch configured so that a change of position of the switch alters a position of at least the device for actuation.

17. The switch pack of claim 16, wherein the plurality of switches comprises at least two different types of switches.

18. The switch pack of claim 16, wherein the device is selected from the group consisting of a metal, a magnetic material, a magnetically conductive metal, and a magnet.

19. A method of using a switch pack, the method comprising:

configuring a switch pack having at least two switches, each switch located above an array of proximity sensors and configured for contactless operation, the switch pack comprising a substrate on which each array of proximity sensors is located in a planar manner and wherein each array comprises at least a first proximity sensor for detecting an object for identification and at least a second proximity sensor for detecting an object for actuation;

exciting at least one proximity sensor from the array of proximity sensors;

determining an identification of each switch by detecting a presence of at least one identification indicator from each switch;

determining a position of at least one switch by detecting and sensing at least one actuation indicator from the at least one switch; and operating a device selected from the group consisting of a vehicle, a piece of equipment, or machinery by using an output from the switch pack for the at least one switch.

20. The method of claim 19, further comprising displaying a status of at least one switch or an operating parameter of the device.

21. The method of claim 19, further comprising using a microcontroller and a multiplexing circuit to sequentially query the proximity sensors and detect the positions of the indicators.

22. The method of claim 19, further comprising programming the microcontroller with an identification pattern and an actuation pattern of the at least two switches.

23. The method of claim 19, wherein the at least two switches comprise two different types of switches.

24. The method of claim 19, wherein the proximity sensors are induction coils and wherein the indicators are lengths of metal or small magnets.

25. The method of claim 19, wherein the proximity sensors are capacitance sensors, hall effect sensors, magnet-detecting sensors, or inductance sensors.

* * * * *